United States Patent [19]

Chamran

[11] 3,790,819

[45] Feb. 5, 1974

[54] LOG AMPLIFIER APPARATUS

[75] Inventor: Morteza Chamran, Elmhurst, Ill.

[73] Assignee: The Perkin-Elmer Corporation, Norwalk, Conn.

[22] Filed: Mar. 17, 1972

[21] Appl. No.: 235,565

[52] U.S. Cl. .................. 307/229, 307/230, 307/310, 328/145

[51] Int. Cl. .......................... G06g 7/12, G06g 7/24

[58] Field of Search ..... 307/229, 230, 310; 328/145

[56] References Cited

UNITED STATES PATENTS

| | | | |
|---|---|---|---|
| 3,369,128 | 2/1968 | Pearlman | 307/229 |
| 3,548,323 | 12/1970 | Gordon et al. | 307/230 |
| 3,381,229 | 4/1968 | Sikorra | 307/229 |
| 3,714,462 | 1/1973 | Blackmer | 307/229 |
| 3,584,232 | 6/1971 | Wallace, Jr. | 307/229 |

*Primary Examiner*—John S. Heyman
*Assistant Examiner*—B. P. Davis
*Attorney, Agent, or Firm*—Daniel R. Levinson

[57] ABSTRACT

An apparatus for increasing the stabilization of a logarithmic amplifier. In the embodiment disclosed, a first operational amplifier is provided to yield a logarithmic output. A semi-conductor device for providing a first logarithmic transfer characteristic is connected to the first amplifier. In order to prevent variation in the amplifier output resulting from the varying parameters of the semi-conductor device, the second amplifier is provided with the semi-conductor device and connected differentially to the first amplifier. The semiconductor devices utilizes first and second PN junctions of semi-conductor material mounted in intimate thermal coupling on a single header or alternatively utilizes a monolithic integrated circuit including a substrate of semiconductor material and means on the substrate for providing the logarithmic transfer characteristic for the first amplifier and means on the substrate for providing the logarithmic transfer characteristic for the second amplifier both deposited on the substrate in intimate thermal coupling with each other.

8 Claims, 5 Drawing Figures

LOG AMPLIFIER APPARATUS

BACKGROUND OF THE INVENTION

In the spectrophotometric field and also in other fields it is necessary to convert linear percent transmittance values to logarithmic absorbance values by use of a linear-to-log conversion circuit. Such circuits are already known to the art and are in use today in commercial spectrophotometers. This disclosure is concerned with an improvement to the type of circuit which uses the log characteristic of a semi-conductor as the conversion device. This has been accomplished by placing one or more semi-conductor junctions in series in the feedback return link of an operational amplifier. The basic theory of this type of circuit is well known in the art and will not be elaborated upon here. Our primary concern is the improvement which provides means to cancel out the effects of various operational influences that have a deleterious influence on the accuracy and stability of such a conversion circuit.

One basic prior art circuit will deliver an output voltage of 60 mV per decade swing of input voltage. However, this value is at a particular ambient temperature and depends on temperature because of the temperature sensitivity of the semi-conductor device. Hence it is necessary to provide accurate temperature stabilization for the semi-conductor, typically within 0.01°C, or significant accuracy will be lost. The log transfer function also depends on other parameters of the semi-conductor which, if not controlled, cause significant errors. This basic circuit therefore leaves much to be desired as a practical measuring device. Efforts to correct these defects with variable gain amplifiers responsive to temperature or with a resistor having a temperature coefficient of 3300 ppm/°C in the feedback loop have been only partially successful.

My invention utilizes a second like amplifier connected to a stable fixed reference voltage input and connected in differential relationship to the first amplifier so that all like variable parameters are opposed and cancel each other. Dual transistors either on a single chip or in close physical relationship on a single header so that their characteristics are substantially identical and so that their thermal coupling is very intimate, are employed with one transistor being connected in the feedback link of one amplifier and the other transistor being connected to the feedback link of the other amplifier. This arrangement, automatically eliminates the necessity for the elaborate heat sinks and other temperature equalizing devices used in prior art circuits. This arrangement not only is accompanied by a stability and accuracy not previously attained, but also achieves economy in cost and in physical size and can be readily fabricated.

SUMMARY OF THE INVENTION

The present invention is generally related to improvements in a logarithmic amplifying system which system includes a first amplifier having an input terminal and an output terminal and a first feedback network connected between the input terminal and the output terminal of the first amplifier. The feedback network is connected so that the signal produced on the output terminal of the first amplifier represents the logarithm of the signal transmitted to the input terminal. The invention relates to improved apparatus for stabilizing the signal produced on the output terminal and includes a second amplifier having an input terminal and an output terminal and a second feedback network connected between the input terminal and the output terminal of the second amplifier.

Means for connecting the input terminal of the second amplifier to a source of predetermined voltage are provided and means are also provided for operatively connecting the output of the second amplifier to the output of the first amplifier. Semi-conductor means for providing a first logarithmic transfer characteristic between a first output point and a second output point and for providing a second logarithmic transfer characteristic between a third output point and a fourth output point are also provided. The invention includes means for connecting the first and second points in the feedback network and means for connecting the third and the fourth output points in the second feedback network so that the connection of the semi-conductor means in both the first and second networks stabilizes the signal produced on the output terminal of the first amplifier.

The invention includes means for enclosing the semi-conductor means in intimate thermal coupling apart from the other components of the system.

In one preferred embodiment, the semi-conductor means comprises a first PN junction of semi-conductor materials and a second PN junction of semi-conductor materials mounted on a single header. In this embodiment, means are provided for electrically isolating the first PN junction from the second PN junction and for connecting the first PN junction to the first and second output points and the second PN junction to the third and fourth output points.

In a second preferred embodiment, the semi-conductor means comprises a monolithic integrated circuit having a substrate of semi-conductor material, first means formed on the substrate for providing the first logarithmic transfer characteristic and second means formed on the substrate for providing the second logarithmic transfer characteristic. In this embodiment, third means are provided for connecting the first means to the first and second output points and fourth means are provided for connecting the second means to the third and fourth output points.

BRIEF DESCRIPTION OF THE DRAWINGS

There follows a brief description of the drawings, showing presently preferred embodiments of the present invention wherein like numerals refer to like elements and wherein.

DETAILED DESCRIPTION OF THE PREFERRED EMBODIMENT

Figure 1:
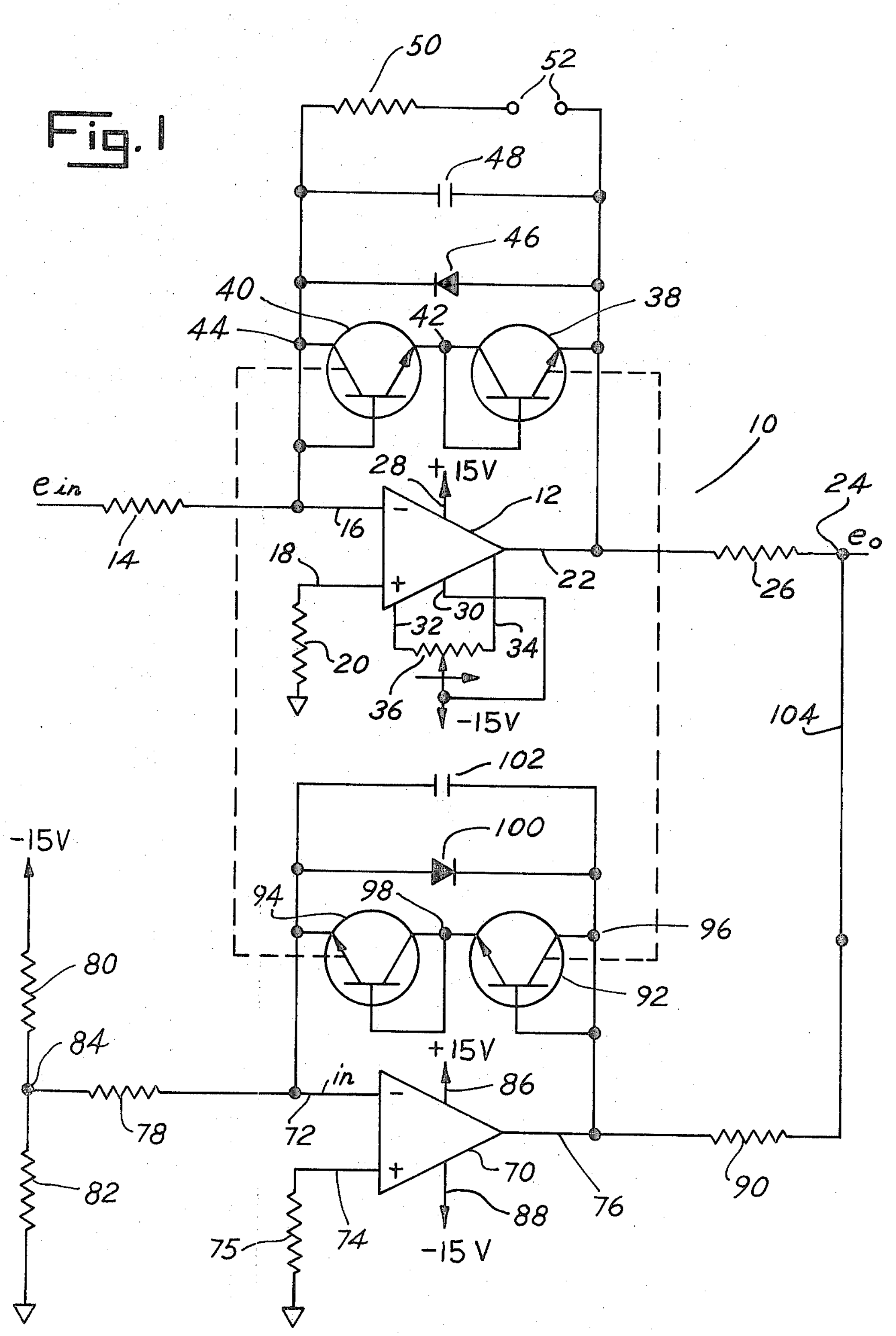
FIG. 1 is a schematic diagram of a presently preferred embodiment of this invention.

Referring to FIG. 1, there is shown in schematic form a presently preferred circuit 10 of this invention. The circuit 10 utilizes a first operational amplifier 12 of the type known in the art. The amplifier 12 is adapted to provide a logarithmically varying output voltage $e_o$ from a linearly varying input voltage $e_{in}$. A resistor 14 is connected in series between the input voltage $e_{in}$ and an inverting input terminal 16 of the amplifier 12. Amplifier 12 also includes a non-inverting input terminal 18 which is connected through a resistor 20 to ground. Amplifier 12 also includes an output terminal 22 connected to an output voltage node 24 through a resistor 26.

Amplifier 12 also includes amplifier terminal 28 connected to a voltage source of +15 volts. Amplifier terminal 30 is connected to a voltage source of −15 volts and amplifier terminals 32 and 34 are connected to the voltage source of −15 volts through a variably tapped control resistor 36.

Connected between the output terminal 22 and inverting input terminal 16 of the first amplifier 12 is a feedback network consisting of NPN transistors 38 and 40. These transistors 38 and 40 function as semiconductor diodes and provide the desired logarithmic transfer characteristic between output terminal 22 and inverting input terminal 16 of the amplifier 12. The emitter of transistor 38 is connected to the output terminal 22 of amplifier 12 and the base and collector of transistor 38 are connected together sharing a common node 42. Likewise, the emitter of transistor 40 is connected to node 42 and the base and collector of transistor 40 are connected together sharing a common node 44 which is connected to amplifier terminal 16.

A limiting diode 46 is connected across transistor 38 and 40 from the emitter of transistor 38 to the collector-base of transistor 40 so as to clamp the maximum voltage which may appear across the transistors 28 and 40 to protect these transistors against excessive current in the case of the reversed input voltage. A capacitor 48 is connected across the transistors 38 and 40 in parallel with the diode 46 to provide high frequency roll-off, so as to prevent singing. A resistor 50 and test point terminals 52 connected in series therewith are connected in parallel across capacitor 48, diode 46 and transistors 38 and 40 so as to allow the variably tapped resistor 36 to be set to provide 0 feedback voltage between the test points 52 for initial scale adjustment.

The circuit 10 also includes a second operational amplifier 70 having an inverting input terminal 72, a non-inverting input terminal 74 and an output terminal 76. The inverting input terminal 72 is connected through a resistor 78 to a source of predetermined voltage and non-inverting terminal 74 is connected through resistor 75 to ground. The predetermined voltage is provided by series connected resistors 80 and 82 sharing a common node 84 and being connected between a voltage source of −15 volts and ground. Resistor 78 is connected in series between the node 84 and the inverting input terminal 72 of the operational amplifier 70. The operational amplifier also includes amplifier terminals 86 and 88 connected to positive and negative voltage sources respectively of 15 volts. The output terminal 76 is connected through an output resistor 90 to node 24 of the first operational amplifier 12.

A feedback network including NPN transistors 92 and 94 is connected between the output terminal 76 and inverting input terminal 72 of the second amplifier 70. The transistors 92 and 94 function as semiconductor diodes. The base and collector of transistor 92 are connected together sharing a common node 96 which is connected to the output terminal 76 of amplifier 70. The base and collector of transistor 94 are connected together sharing a common node 98 which is connected to the emitter of transistor 92. The emitter of transistor 94 is connected to the input terminal 72 of amplifier 70. It should be noted that the polarity of transistors 92 and 94 in relation to the input and output terminals of amplifier 70 is opposite to the polarity of transistors 38 and 40 in relation to the input and output terminals of amplifier 12. This opposite polarity connection is provided to stabilize the signal $e_o$ produced at node 24 of the amplifier 12 so as to offset the effects of temperature and other variables on the transistors 38 and 40. The collectors of transistors 38, 40, 92 and 94 are connected respectively to the bases thereof so as to remove the influence of the collector in the feedback networks.

A limiting diode 100 is connected in reverse polarity to the transistors 92 and 94 and in parallel therewith to prevent excessive reverse current through the transistor 92 and 94. A capacitor 102 is connected in parallel with transistors 92 and 94 and in parallel with diode 100 to provide high frequency roll-off preventing singing. The values of the components shown in the schematic diagram of FIG. 1 are as follows in one form of the preferred embodiment of this invention.

| Component | Value |
|---|---|
| $R_{14}$ | 10K |
| $R_{20}$ | 4.75K |
| $R_{26}$ | 41.2K |
| $R_{36}$ | 10K |
| $R_{50}$ | 100K |
| $R_{75}$ | 4.75K |
| $R_{78}$ | 10K |
| $R_{80}$ | 2.49K |
| $R_{82}$ | 210Ω |
| $R_{90}$ | 41.2K |
| $C_{48}$ | 0.01μf |
| $C_{102}$ | 0.01μf |

Utilizing the two transistors 38 and 40 in the feedback network for amplifier 12 and the two transistors 92 and 94 in the feedback network for amplifier 70, it is possible to have an accurate logarithmic range of three to five decades. It is also possible to utilize only a single transistor-diode 38 in the feedback network for amplifier 12 and likewise a single transistor-diode 92 in the feedback network for amplifier 70. In this case, the first transistor diode 38 and second transistor diode 92 function as semi-conductor means for providing a first logarithmic transfer characteristic between a first output point 22 and a second output point 42 and for providing a second logarithmic transfer characteristic between a third output point 96 and a fourth output point 98. As may be seen, output points 22 and 42 are connected in the feedback network for the amplifier 12 and the output points 96 and 98 are connected in the feedback network for amplifier 70. Resistors 26 and 90 together with the lead 104 connecting resistors 26 and 90 form a means for operatively connecting the output of amplifier 70 to the output of amplifier 12. When transistors 40 and 94 are also utilized in the feedback paths for amplifiers 12 and 70 respectively, the transistors 40 and 94 function as a second semi-conductor means for providing a third logarithmic transfer characteristic between fifth and sixth output points (ie between node 42 and input terminal 16) and for providing a fourth logarithmic transfer characteristic between seventh and eighth output point (ie between node 98 and terminal 72). As may be seen from the foregoing, the fifth and sixth output points are in series with the first and second output points and the seventh and eighth output points are in series with the third and fourth output points.

In order to insure that the temperature effects in the feedback network for amplifier 12 are the same as the temperature effects in the feedback for amplifier 70, the transistors 38 and 92 are formed in close physical relationship with respect to one another as are the transistors 40 and 94. This connection of transistors in close physical relationship is described below.

Figure 2:
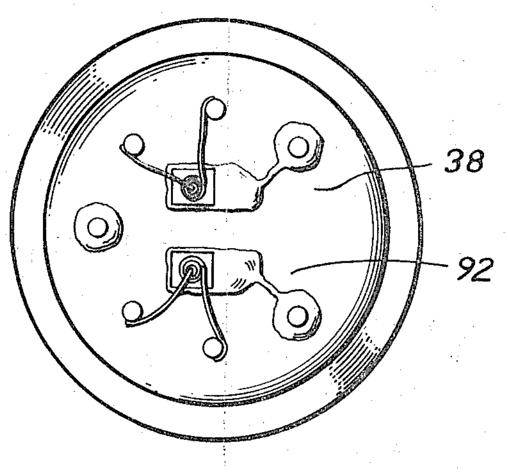
FIG. 2 is a top plan view of a first preferred embodiment of the semi-conductor device utilized in this invention.
Figure 3:
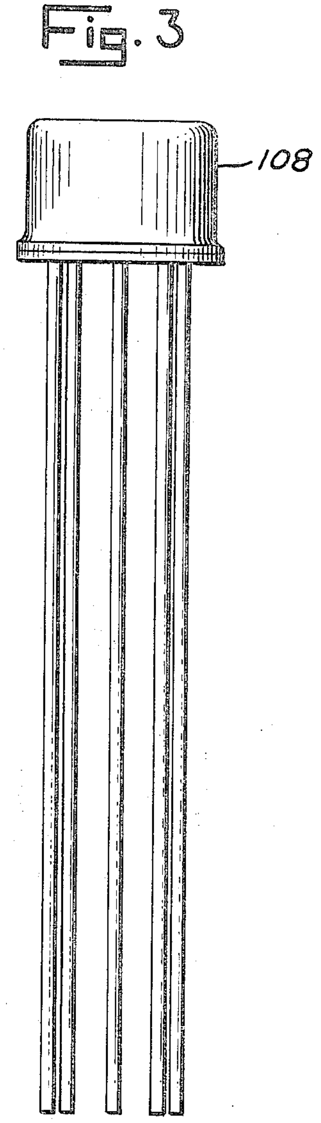
FIG. 3 is a side elevational view of the semi-conductor device shown in FIG. 2.
Figure 4:
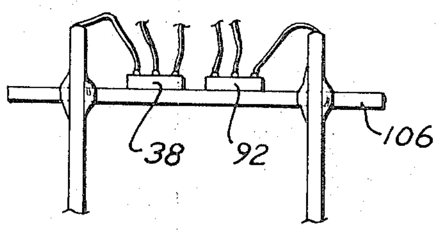
FIG. 4 is a side plan view of the semi-conductor device of FIG. 2.

The transistor diodes 38 and 92 are constructed as shown in FIGS. 2–4. Transistor diodes 40 and 94 are constructed in an identical manner and therefore the description of transistors 38 and 92 will be equally applicable to transistors 40 and 94.

These transistors 38 and 92 are dual NPN annular transistors each having an operative PN junction of semi-conductor material. The transistors 38 and 92 are mounted on a single header 106 as shown in FIG. 4. The transistors 38 and 92 are electrically isolated from one another on the header 106 and are provided with a container means 108 for enclosing the transistors 38 and 92 from the remaining components of the system. These transistors may be of the type designated as 2N 2913-2N2920 and 2N2972 - 2N 2979. The transistors 38 and 92 are connected as shown in the schematic diagram of FIG. 1.

Figure 5:
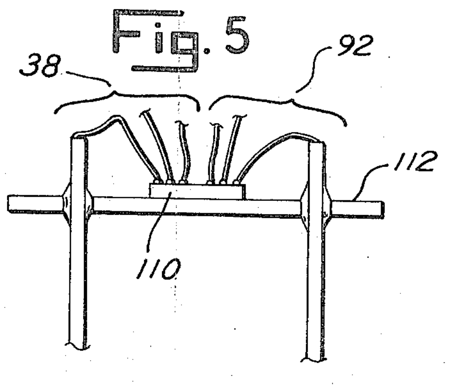
FIG. 5 is a side plan view of a second preferred embodiment of a semi-conductor device utilized in this invention.

In the second preferred embodiment shown in FIG. 5, the transistors 38 and 92, acting as semi-conductors are a monolithic integrated circuit including a substrate of semi-conductor material 110 which is deposited on a header 112. These dual monolithic NPN transistors 38 and 92 are of the type described in a publication by Analog Devices dated July, 1971 and entitled LINEAR IC DUAL NPN TRANSISTORS, Series AD 810 through AD 813. This publication is hereby incorporated by reference. The dual transistors 38 and 92 constructed in accordance with the second preferred embodiment are also provided with a container means 108 for enclosing the transistors 38 and 92 from the remaining components of the system.

While in the foregoing there have been described presently preferred embodiments of the present invention, it is to be understood that these embodiments are merely illustrative of the true spirit and scope of this invention and that numerous modifications may be made to these embodiments without departing from the true spirit and scope of the invention.

What is claimed is:

1. In a logarithmic amplifying system comprising a first amplifier having an output terminal and an input terminal adapted to receive a first input signal having a first polarity and also comprising a first feedback network connected between the input terminal and the output terminal of the first amplifier so that the signal produced on the output terminal represents the logarithm of the first input signal, improved apparatus for stabilizing the signal produced on the output terminal comprising:

a second amplifier having an input terminal and an output terminal;

a second feedback network connected between the input terminal and the output terminal of the second amplifier;

means for connecting the input terminal of the second amplifier to a source of predetermined reference voltage having a second polarity opposite the polarity of the first input signal;

first semi-conductor means for providing a first logarithmic transfer characteristic having a predetermined polarity between a first output point and a second output point and second semi-conductor means for providing a second logarithmic transfer characteristic having a predetermined polarity between a third output point and a fourth output point;

means for connecting the first and second output points in the first feedback network and for connecting the third and fourth output points in the second feedback network so that the polarity of the first semi-conductor means in relation to the input and output terminals of the first amplifier is opposite the polarity of the second semi-conductor means in relation to the input and output terminals of the second amplifier; and means for algebraically summing the signals of opposite polarity conducted to the output terminals of the first and second amplifiers, whereby the opposed polarity of the first and second semi-conductor means stabilizes the summed output signal.

2. Apparatus, as claimed in claim 1, and further comprising means for enclosing the semi-conductor means in intimate thermal coupling apart from the remaining components of the system.

3. Apparatus, as claimed in claim 1, wherein the semi-conductor means comprises:

first means for forming a first PN junction of semi-conductor materials;

second means for forming a second PN junction of semi-conductor materials;

third means for mounting the first and second means on a single header in intimate thermal coupling;

fourth means for electrically isolating the first means from the second means;

fifth means for connecting the first means to the first and second output points; and sixth means for connecting the second means to the third and fourth output points.

4. Apparatus, as claimed in claim 3, wherein the fifth means comprises means for connecting the first means so that the first PN junction produces a voltage drop having a first predetermined polarity with respect to the input terminal of the first amplifier and wherein the sixth means comprises means for connecting the second means so that the second PN junction produces a voltage drop having a polarity opposite the first predetermined polarity with respect to the input terminal of the second amplifier.

5. Apparatus, as claimed in claim 3, wherein the first and second means each comprises a transistor.

6. Apparatus, as claimed in claim 1, wherein the semi-conductor means comprises:

a monolithic integrated circuit comprising a substrate of semi-conductor material, first means formed on the substrate for providing said first logarithmic transfer characteristic and second means formed on the substrate for providing said second logarithmic transfer characteristic;

third means for connecting the first means to the first and second output points; and fourth means for connecting the second means to the third and fourth output points.

7. Apparatus, as claimed in claim 6, and further comprising means for enclosing the semi-conductor means in intimate thermal coupling apart from the remaining components of the system.

8. Apparatus, as claimed in claim 1, and further comprising:

second semi-conductor means for providing a third logarithmic transfer characteristic between a fifth output point and a sixth output point and for providing a fourth logarithmic transfer characteristic between a seventh output point and an eighth output point;

means for connecting the fifth and sixth output points in series with the first and second output points;

means for connecting the seventh and eighth output points in series with the third and fourth output points.

* * * * *